United States Patent [19]
Kogure

[11] 4,453,105
[45] Jun. 5, 1984

[54] MODE COUPLED QUARTZ CRYSTAL TUNING FORK

[75] Inventor: Shigeru Kogure, Suwa, Japan

[73] Assignee: Kabushiki Kaisha Suwa Seikosha, Tokyo, Japan

[21] Appl. No.: 299,420

[22] Filed: Sep. 4, 1981

[30] Foreign Application Priority Data

Sep. 8, 1980 [JP] Japan .................. 55-124266

[51] Int. Cl.³ .................................. H01L 41/08
[52] U.S. Cl. ............................ 310/361; 310/370
[58] Field of Search .................. 310/360, 361, 370

[56] References Cited
U.S. PATENT DOCUMENTS 4,320,320 3/1982 Momosaki et al. ............... 310/361

FOREIGN PATENT DOCUMENTS

| 54-40589 | 3/1979 | Japan | 310/370 |
| 54-100685 | 8/1979 | Japan | 310/370 |
| 54-116191 | 9/1979 | Japan | 310/370 |
| 2006520 | 5/1979 | United Kingdom | 310/370 |

*Primary Examiner*—Mark O. Budd
*Attorney, Agent, or Firm*—Blum, Kaplan, Friedman, Silberman & Beran

[57] ABSTRACT

A mode coupled tuning fork resonator is cut at a preferred angle and with selected length, width, and thickness to produce a resonator having a highly favorable frequency-temperature characteristic over a wide range of operating temperatures. The frequency-temperature characteristic can be expressed in a Taylor's expansion dominated by the fourth power term.

9 Claims, 7 Drawing Figures

MODE COUPLED QUARTZ CRYSTAL TUNING FORK

BACKGROUND OF THE INVENTION

This invention relates generally to a mode coupled tuning fork crystal resonator of the type used in timepieces and instruments requiring highly accurate time measurement, and more particularly, to a tuning fork resonator having a frequency-temperature characteristic represented by the fourth power term of a Taylor's expansion at the nominal operating temperature. Electronic wristwatches in the prior art have utilized a +5° x-cut quartz tuning fork using the flexural mode of vibration because the resonator has a parabolic second order frequency-temperature characteristic at room temperature which is advantageous in precision of timekeeping. This type of resonator operates at a low frequency which results in low power consumption. However, the watch has a timing inaccuracy of a approximately twenty seconds a month.

In order to provide electronic wristwatches which have improved precision and long battery life in operation, mode coupled quartz crystal tuning fork resonators have been developed having a cubic frequency-temperature characteristic when operating at a low frequency and at room temperature. Such a development is described in detail in Japanese patent application Nos. 53-23903, 53-149499 and 53-149500. The latter two applications correspond to U.S. application ser. No. 42,732 filed May 29, 1979, which is incorporated herein by reference.

A mode coupled tuning fork type vibrator as described in application Ser. No. 42,732, has a frequency-temperature characteristic which can be represented mathematically as a Taylor's expansion about a room temperature of 20° C. Therein, the first and second coefficients α and β are made equal to zero whereby a frequency-temperature characteristic in cubic form is produced. This result is achieved by cutting the tuning fork resonator from the crystal at a preferred angle and with a selected thickness so as to provide close coupling between a flexural and a torsional mode of vibration. The frequency-temperature characteristics of such a resonator are quite good in that there is a variation of one part per million (ppm) or less over an operating temperature range of 0° to 40° C. With such a resonator used in an electronic wristwatch, the wristwatch operates with an extremely high timekeeping precision and the time variation is only a few seconds per year.

However, when wristwatches are used in a cold ambient condition, the precision of the wristwatch is affected to a large measure by the frequency-temperature characteristics which are present below the temperature of 0° C. Where the previously developed mode coupled tuning fork vibrator, or an AT-cut resonator, having a cubic frequency-temperature characteristic is used as a standard frequency source for communication equipment, it is desirable that the frequency be unchanged in a wider range of temperatures than 0° to 40° C. because the equipment is seldom put into operation at temperatures equal to those of a human body. It is especially desired that standard frequency sources for communication equipment be subject to frequency variations of 3 ppm or less in a temperature range from −30° C. to +60° C. To meet such a requirement, a conventional AT-cut resonator relies on a voltage controlled crystal oscillator (VCXO) and a temperature compensated crystal oscillator (TCXO) to reduce frequency changes due to ambient temperature variations. These methods however are disadvantageous in that the oscillators consume increased energy, are large in size, and for these reasons are not suitable for use in small sized equipment.

What is needed is a mode coupled tuning fork crystal resonator which has good frequency-temperature characteristics over an extended operating range from −30° to +60° C.

SUMMARY OF THE INVENTION

Generally speaking, in accordance with the invention, a mode coupled quartz tuning fork resonator especially suitable for precision timekeeping over a wide range of temperatures is provided. The tuning fork resonator is cut at a preferred angle with selected width, length and thickness so as to provide a close coupled relationship between the first flexural overtone and fundamental torsional modes of vibration of the arms. This vibrator has a highly favorable frequency-temperature characteristic. The relationship between the first overtone resonant frequency and the temperature can be approximated mathematically by a Taylor's expansion having a first order term with a coefficient $\alpha$, a second order term with the coefficient $\beta$, a third order term with a coefficient $\gamma$, and a fourth order term with the coefficient $\delta$. The crystal is cut at a selected angle $\phi$ and the tuning fork is dimensioned such that the coefficients $\alpha$, $\beta$, and $\gamma$ are approximately zero. As a result, the frequency-temperature relationship has a characteristic which varies by the fourth power of temperature and changes in the flexural resonant frequency with changes in temperature are minimized over an extended working range of the vibrator between −30° C. and +60° C. The relationship of width to length of the tuning fork arms allows the third order coefficient $\gamma$ to be set to zero.

Accordingly, it is an object of this invention to provide an improved mode coupled quartz tuning fork resonator operating at a low frequency and having excellent frequency-temperature characteristics.

Another object of this invention is to provide an improved mode coupled quartz tuning fork resonator which varies by one part per million or less in a temperature range of 0° C. to 40° C.

A further object of this invention is to provide an improved mode coupled quartz tuning fork resonator which operates at low frequency and with low power consumption.

Still another object of this invention is to provide an improved mode coupled quartz tuning fork resonator which is thin and can be produced by photolithographic techniques.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

It has been found that the frequency-temperature relationship of a mode coupled quartz tuning fork resonator can be approximated mathematically by a Taylor's expansion. The present invention relates to an improvement in the frequency-temperature characteristic of such a mode coupled quartz tuning fork resonator, and more particularly to the realization of a fourth power frequency-temperature characteristic centered at room temperature. In the referenced patent applications, the development of a mode coupled quartz tuning fork resonator having a cubic frequency-temperature characteristic is described. This resonator operates with a low frequency and low power consumption at room temperature. A mode coupled quartz tuning fork resonator in accordance with this invention utilizes the first overtone of vibration in the flexural mode ($F_1$ mode) as the main or primary vibration and a torsional fundamental mode of vibration ($T_0$ mode) as the secondary or sub-vibration. The frequency-temperature characteristic of the resonant flexural overtone vibration, that is, the $F_1$ mode, when coupled with the torsional fundamental vibration, that is, the $T_0$ mode, can be expressed by a Taylor's expansion about the nominal operating temperature T of 20 degrees C. as follows:

$$f(T) \approx f(20)[1 + \alpha(T-20) + \beta(T-20)^2 + \gamma(T-20)^3 + \delta(T-20)^4] \quad (1)$$

where $\alpha$ is the first-order temperature coefficient,
$\beta$ is the second-order temperature coefficient,
$\gamma$ is the third-order temperature coefficient, and
$\delta$ is the fourth-order temperature coefficient.

The fifth power term and higher terms of the (T-20) expansion are small and negligible relative to the fourth-order term.

The mode coupled quartz tuning fork resonator described in the referenced patent applications has a cubic frequency-temperature characteristic at room temperature. This means that in the Taylor's expansion the coefficients $\alpha$ and $\beta$ are both equal to zero, that is:

$$\alpha = \beta = 0 \quad (2)$$

The development of the relationship (2) is now described.

Figure 1:
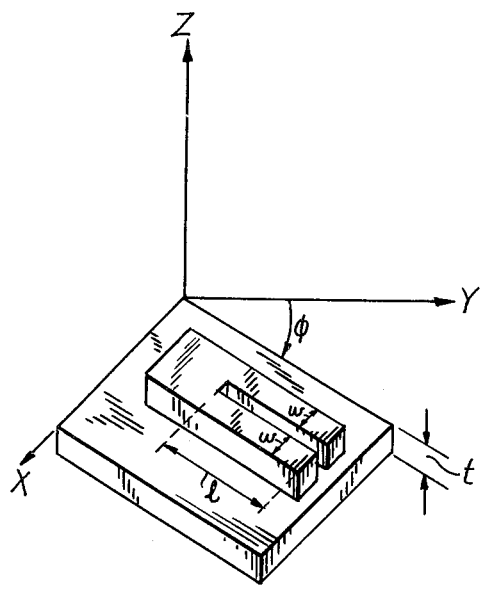
FIG. 1 shows the axes of a quartz crystal and the cutting angle for producing a tuning fork resonator in accordance with this invention.

FIG. 1 shows how a tuning fork resonator is cut from a quartz crystal plate. The coordinate axes X, Y and Z indicate the electrical, mechanical and optical axes, respectively to a quartz crystal. A tuning fork having a thickness t, an arm width w, and an arm length l, is illustrated as cut from a Z-plate which has been rotated in a clockwise direction, that is, the negative direction, about the X axis through a cutting angle $\phi$. Using the standards for specifying crystal cuts established in the HANDBOOK OF PIEZOELECTRIC CRYSTALS FOR RADIO EQUIPMENT DESIGNERS, WADC TECHNICAL REPORT NO. 54-248, 1954, pages 21-22, this cut is defined as zyw $\phi$.

Figure 2:
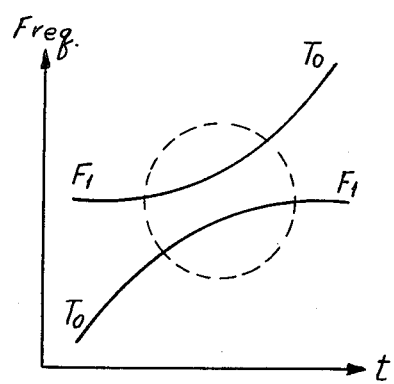
FIG. 2 is mode chart of frequency versus crystal thickness for the crystal tuning fork resonator of FIG. 1.

As illustrated in FIG. 2, in a region where the resonant frequencies of the two modes, that is, the first overtone in flexure and the fundamental in torsion, become very close to each other, the vibrational modes become coupled. The frequency range of such coupling is indicated by the broken circular line.

Figure 3:
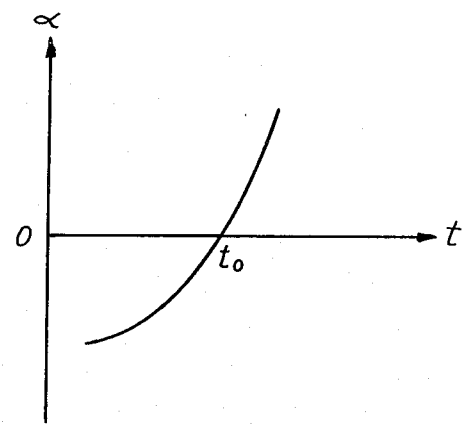
FIG. 3 is a graph showing variations in the first order coefficient $\alpha$ versus thickness for the mode coupled resonator of FIG. 1.

As the thickness t in the region of coupling is varied, $\alpha$ of the flexural overtone vibrational mode changes as illustrated in FIG. 3. The value of the first coefficient $\alpha$ becomes zero at a thickness designated at $t_0$.

Figure 4:
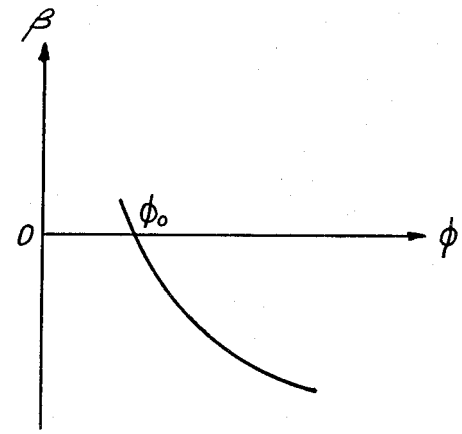
FIG. 4 is a graph showing variation in the second order coefficient $\beta$ with respect to the cutting angle $\phi$ of the mode coupled resonator of FIG. 1 and FIG. 3.

To make the second coefficient $\beta$ of the Taylor's expansion also equal to zero concurrently with the first term $\alpha$ equalling zero, the cutting angle $\phi$ is changed and generally $\alpha$ equal zero when $\beta$ equal zero as a result of coupling. FIG. 4 shows values of $\beta$ with respect to the cutting angle $\phi$, when $\alpha$ is zero as a result of selecting a suitable thickness t. Thus, $\alpha$ equal $\beta$ equal zero when $\phi$ equal $\phi_0$. In this condition the frequency-temperature characteristics as expressed by the Taylor's expansion (1) present a cubic curve. In particular, since the fourth order coefficient $\delta$ is much smaller than the third order coefficient $\gamma$, the resultant curve shows a cubic characteristic. Two parameters, namely, thickness t, which can be referred to as the degree of coupling, and a cutting angle $\phi$ are adjusted for the relationships $\alpha$ equal zero and $\beta$ equal zero, as more fully described in the referenced patents.

Figure 5:
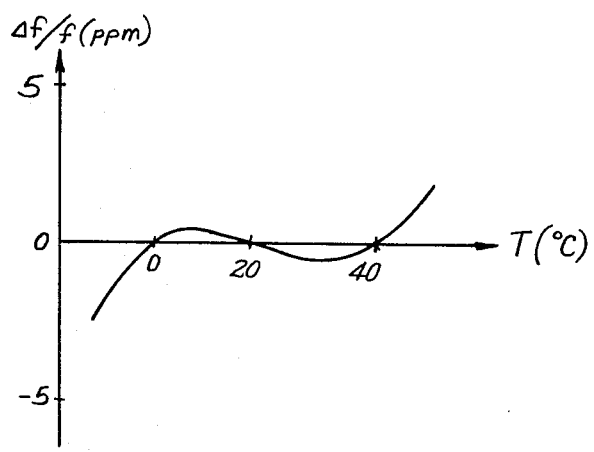
FIG. 5 is a graph of the frequency versus temperature characteristics of a mode coupled quartz tuning fork resonator of an earlier development.

FIG. 5, illustrates the frequency-temperature characteristics of a mode coupled quartz tuning fork resonator produced in accordance with the foregoing process. This is the cubic characteristic which results when the first and second coefficients in the Taylor's expansion are equal to zero. The frequency-temperature characteristics of such a resonator are quite good in that there is a variation of only one part per million or less over the temperature range of 0° to 40° C. With such a resonator used in an electronic wristwatch, the wristwatch is of extremely high precision with a timing inaccuracy of only a few seconds a year.

However, when wristwatches are used in a cold climate, the timekeeping precision of the wristwatch is affected to a large degree below the temperature of 0° C. That is, the frequency-temperature characteristic is not so favorable at and below the temperature of 0° C. Where the tuning fork type resonator or an AT-cut resonator having the cubic frequency-temperature characteristic, as described immediately above, is used as a standard frequency source for communication equipment, it is desirable that the frequency be stable over a wider range of temperatures because the equipment is seldom put into operation at temperatures which only equal those of a human body. It is especially desirable that the standard frequency source or communication equipment be subject to the frequency variations of three parts per million or less in a temperature range from $-30°$ C. to $+60°$ C.

To meet such a requirement, the conventional AT-cut resonator has relied on a voltage controlled crystal oscillator or a temperature compensated crystal oscillator circuit (VCXO and TCXO, respectively) to reduce frequency variations due to ambient temperature changes. When these techniques are used to reduce frequency variation, there are disadvantages in that the oscillator circuits consume increased energy and are large in size. Hence, these oscillators are not suitable for use in small sized equipment.

It is an object of the present invention to provide a small sized and inexpensive resonator providing increased precision for electronic wristwatches and a standard frequency source for smallsized communication equipment. Stated otherwise, it is an object to make the third order temperature coefficient $\gamma$ of the mode coupled quartz tuning fork resonator attain a zero value.

Figure 6:
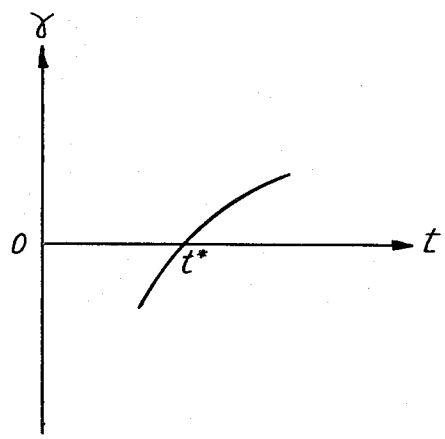
FIG. 6 illustrates a third order temperature coefficient with respect to variations in thickness of a mode coupled quartz tuning fork resonator of FIG. 1.

FIG. 6 shows a relationship of $\gamma$ with respect to the thickness t. In this Figure, t is first determined and then lw and the cutting angle $\phi$ are determined so as to attain the relationship $\alpha$ equal $\beta$ equal zero. FIG. 6 indicates $\gamma$ when $\alpha$ equal $\beta$ equal zero when the thickness is t* resulting in a fourth power frequency-temperature characteristic. The process is described in more detail hereinafter.

Assuming that the resonant frequencies of the $F_1$ mode and the $T_0$ mode are $f_F$ and $f_T$, respectively. These frequencies can be represented as follows:

$$f_F = K_F(w/l^2) \qquad (2)$$

$$f_T = \frac{K_T}{l}\left[\frac{t}{w} - \frac{1}{3}\left(\frac{t}{w}\right)^2\right] \qquad (3)$$

where $K_F$, $K_T$ are constants.

Assume that $$R = f_T/f_F \qquad (4)$$

It is known that R corresponds to the frequency-temperature characteristic, that is, when R approaches unity, the two modes of vibration become close in frequency and coupled. From the equations (2) and (3), the following expression is obtained:

$$R = \frac{K_T l}{K_F w}\left[\left(\frac{t}{w}\right) - \frac{1}{3}\left(\frac{t}{w}\right)^2\right] \qquad (5)$$

Assuming that the value of R when $\alpha=0$ is $R_0$. The expression (5) becomes:

$$R_0 = \frac{K_T l}{K_F w}\left[\left(\frac{t}{w}\right) - \frac{1}{3}\left(\frac{t}{w}\right)^2\right] \qquad (6)$$

With the value for designing of $f_F$ being $F_{fo}$, the equation (2) gives:

$$f_{Fo} = K_F(w/l^2) \qquad (7)$$

There is a range of values of t which make $\alpha$ and $\beta$ equal zero. That is depending on the values of w and l. There are many values of t where $\alpha$ and $\beta$ equal zero. However, the third power coefficient $\gamma$ is dependent on w/l. It has been found that there is a unique value of t which makes $\alpha$ equal $\beta$ equal zero while at the same time in relation to a value of w/l, makes $\gamma$ approach zero. This particular thickness t is indicated as t* in FIG. 6. At this condition $\alpha$ equal $\beta$ equal $\gamma$ equal zero.

Figure 7:
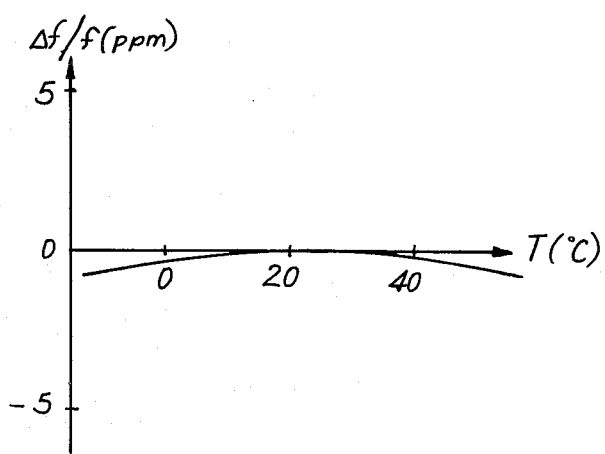
FIG. 7 shows the frequency-temperature characteristics of the mode coupled quartz tuning fork resonator of FIG. 1 in accordance with this invention.

FIG. 7 is the frequency-temperature characteristic of a mode coupled quartz tuning fork resonator produced in accordance with the present invention. The frequency-temperature characteristic is dominated by the fourth order term in the Taylor's expansion. That is, the frequency-temperature characteristic is excellent over a wide range of temperatures as the third order temperature coefficient is zero along with the first and second temperature coefficient being zero.

It has been found that four cut angles exist which permit $\alpha$ equal $\beta$ equal zero. Such tuning fork resonators are cut from plates given the following designations by the standards cited above.

zyw $-12.5°\pm20\%$ zyw $+25°\pm20\%$ zyl $-40°\pm10\%$ zyl $+40°\pm10\%$

The cutting angles are variable in the range of from $\pm10\%$ to $\pm20\%$ dependent on the difference between synthetic and natural quartz. Using these cutting angles, t and w/l which give the desired relationship of $\alpha$, $\beta$, and $\gamma$ all simultaneously equalling zero are as follows:

$t=50\mu \sim 500\mu$, and $w/l = 0.08 \sim 0.15$

Tuning fork type resonators having a thickness equal or less than 200 microns can be fabricated using photolithographic techniques. Thus, they can be produced in small sizes with higher yields and lower cost.

Electronic wristwatches which incorporate a mode coupled quartz tuning fork resonator in accordance with the present invention having $\alpha$ equal $\beta$ equal $\gamma$ equal zero for the coefficients in the Taylor's expansion operate uniformly with high precision in a wide variety of embodiments. The resonator of the present invention is used as a small sized standard frequency source in communication equipment and is well stabilized against ambient temperature variations in the expanded range stated above.

It should be understood that whereas the present invention has been described as directed to a mode coupled quartz tuning fork resonator using the flexural first overtone mode as the primary frequency, the basic principles of the invention are also applicable to a mode coupled quartz tuning fork resonator using a higher overtone and to mode coupled quartz tuning fork resonators using other vibrational modes.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A quartz crystal tuning fork resonator having a first resonant frequency of vibration which changes with changes in ambient temperature, the relationship between said first resonant frequency and said temperature being approximated mathematically by a Taylor's expansion having at least a first order term with a coefficient $\alpha$, a second order term with a coefficient $\beta$, a third order term with a coefficient $\gamma$, and a fourth order term with a coefficient $\delta$, said resonator being produced from quartz crystal having an electrical X-axis, a mechanical Y-axis and an optical Z-axis, said resonator having at least a second resonant frequency of vibration, said first and second resonant frequencies of vibration being close in frequency and coupled, said crystal being cut at a selected thickness coupling said frequencies and making said first coefficient $\alpha$ approximately equal to zero, said crystal resonator being cut at a selected angle causing said second coefficient $\beta$ to approximately equal zero, the arms of said tuning fork vibrator having a selected width to length ratio causing said third coefficient $\gamma$ to approximately equal zero, the resultant frequency-temperature relationship having a fourth power characteristic and said changes in resonant frequency with said changes in ambient temperature are minimized over an extended working range of said vibrator.

2. A quartz crystal tuning fork resonator as claimed in claim 1, wherein said first resonant frequency is a flexural vibration and said second resonant frequency is a torsional vibration.

3. A quartz crystal tuning fork resonator as claimed in claim 2, wherein said first resonant frequency is the first overtone of flexural vibration and said second resonant frequency is the fundamental torsional vibration.

4. A quartz crystal tuning fork resonator as claimed in claim 3, wherein resonator thickness is in a range of 50 to 500 microns, and the ratio of tuning fork arm width to tuning fork arm length is in a range of 0.08 to 0.15.

5. A quartz crystal tuning fork resonator as claimed in claim 4, wherein the tuning fork resonator is cut:

$$zyw - 12.5° \pm 20\%.$$

6. A quartz crystal tuning fork resonator as claimed in claim 4, wherein the tuning fork resonator is cut:

$$zyw25° \pm 20\%.$$

7. A quartz crystal tuning fork resonator as claimed in claim 4, wherein the tuning fork resonator is cut:

$$zyl - 40° \pm 10\%.$$

8. A quartz crystal tuning fork resonator as claimed in claim 4, wherein the tuning fork resonator is cut:

$$zyl + 40° \pm 10\%.$$

9. A quartz crystal tuning fork resonator as claimed in claim 1, wherein the thickness of said resonator does not exceed 200 microns, the resonator being the product of a photolithographic technique.

* * * * *